United States Patent
Shivaray et al.

(10) Patent No.: US 10,169,177 B1
(45) Date of Patent: Jan. 1, 2019

(54) NON-DESTRUCTIVE ONLINE TESTING FOR SAFETY CRITICAL APPLICATIONS

(71) Applicant: Xilinx, Inc., San Jose, CA (US)

(72) Inventors: Banadappa V Shivaray, Yadgiri (IN); Pranjal Chauhan, Fatehpur (IN); Pramod Surathkal, Hyderabad (IN); Alex S. Warshofsky, Miami Beach, FL (US); Tomai Knopp, San Jose, CA (US); Soumitra Kumar Bhowmick, Hyderabad (IN); Ahmad R. Ansari, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/802,274

(22) Filed: Nov. 2, 2017

(51) Int. Cl.
*G06F 11/22* (2006.01)
*G06F 17/50* (2006.01)
*H03K 19/003* (2006.01)

(52) U.S. Cl.
CPC ...... *G06F 11/2284* (2013.01); *G06F 17/5054* (2013.01); *H03K 19/003* (2013.01)

(58) Field of Classification Search
CPC .......... G06F 11/2284; G06F 17/5054; H03K 19/003
USPC .............................................................. 326/9
See application file for complete search history.

(56) References Cited

U.S. PATENT DOCUMENTS

| | | | |
|---|---|---|---|
| 6,115,763 A * | 9/2000 | Douskey | G06F 11/267 710/20 |
| 6,857,092 B1 | 2/2005 | Fox | |
| 7,020,598 B1 | 3/2006 | Jacobsen | |
| 7,117,416 B1 | 10/2006 | Fox | |
| 7,133,822 B1 | 11/2006 | Jacobsen | |
| 7,216,277 B1 | 5/2007 | Ngai et al. | |
| 7,302,625 B1 | 11/2007 | Payakapan et al. | |
| 7,409,610 B1 | 8/2008 | Drimer | |
| 8,667,192 B2 | 3/2014 | Allaire et al. | |
| 9,454,498 B1 | 9/2016 | Allaire et al. | |
| 9,846,583 B2 * | 12/2017 | Ansari | G06F 9/4403 |
| 9,887,203 B2 * | 2/2018 | Or-Bach | H01L 27/1128 |
| 2004/0186688 A1 * | 9/2004 | Nejedlo | G06F 11/27 702/186 |
| 2009/0013224 A1 * | 1/2009 | Ziaja | G06F 11/2236 714/724 |
| 2016/0275008 A1 * | 9/2016 | McLaughlin | G06F 11/2236 |

* cited by examiner

*Primary Examiner* — Dylan C White
(74) *Attorney, Agent, or Firm* — Carleton Clauss

(57) ABSTRACT

Embodiments herein describe a methodology for performing non-destructive LBIST when booting an integrated circuit (IC). In one embodiment, when powered on, the IC begins the boot process (e.g., a POST) which is then paused to perform LBIST. However, instead of corrupting or destroying the boot mode state of the IC, the LBIST is non-destructive. That is, after LBIST is performed, the booting process can be resumed in the same state as when LBIST began.

18 Claims, 6 Drawing Sheets

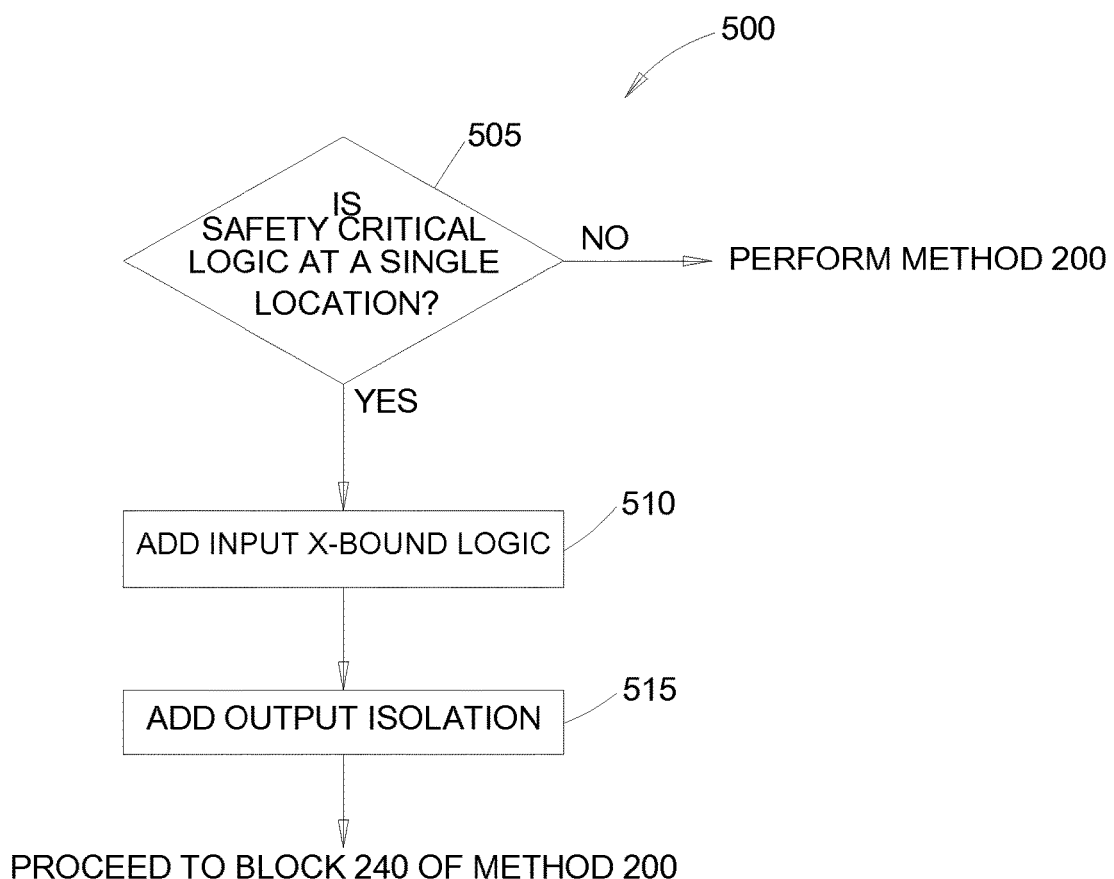

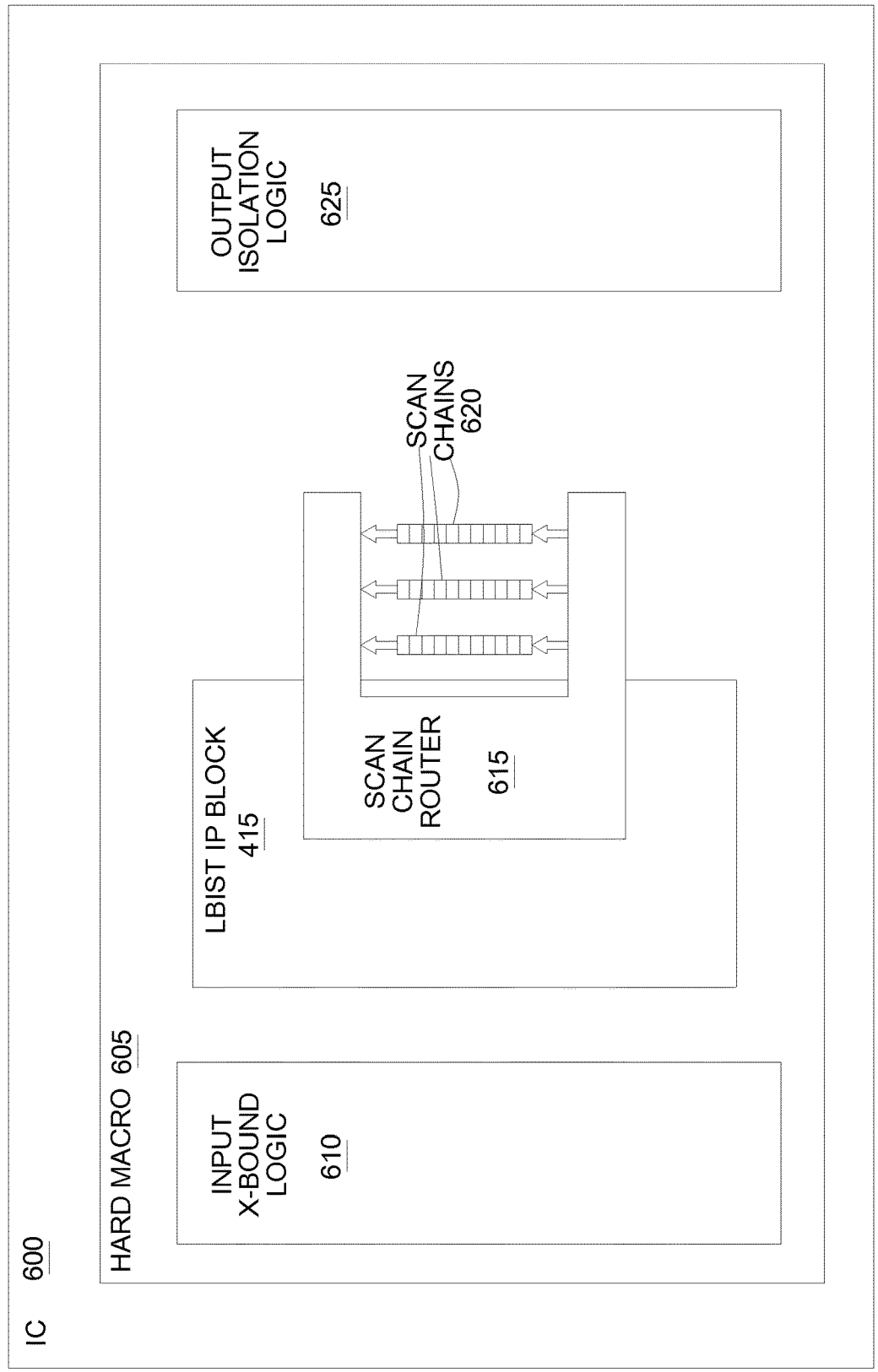

NON-DESTRUCTIVE ONLINE TESTING FOR SAFETY CRITICAL APPLICATIONS

TECHNICAL FIELD

Examples of the present disclosure generally relate to designing and operating an integrated circuit that performs non-destructive self-testing.

BACKGROUND

Logic built-in self-test (LBIST) is a form of built in self-test (BIST) in which hardware and/or software is built into integrated circuits allowing them to test their own operation as opposed to coupling the integrated circuits to an external testing apparatus (e.g., automated test equipment). One advantage is the ability to trigger the LBIST of an integrated circuit while running a BIST or power-on self-test (POST) of the finished product.

However, performing LBIST during a booting process (e.g., when performing POST) can alter or change the state of the boot process as LBIST testing is destructive testing. As a result, when LBIST is finished, the state of the boot process has changed which can negatively impact the functionality of the integrated circuit. As such, LBIST is a destructive test where the boot mode state of the chip under LBIST is corrupted during testing. The POST block is added to meet the ISO26262 standard.

SUMMARY

Techniques for performing non-destructive LBIST in an integrated circuit are described. One example is an integrated circuit that includes boot critical circuitry configured to change a mode of the integrated circuit from a boot mode to a test mode, first circuitry, and LBIST circuitry configured to perform a test on the first circuitry in response to switching from the boot mode to the test mode. Moreover, the test is non-destructive to the boot critical circuitry such that a boot mode state of the integrated circuit is preserved when performing the test.

One example described herein is a method of designing an integrated circuit. The method includes adding, using a design tool, boot critical logic to a design of the integrated circuit, the boot critical logic is configured to change a mode of the integrated circuit from a boot mode to a test mode. The method includes adding, using the design tool, first logic to the design and adding, using the design tool, LBIST logic configured to perform a test on the first logic in response to switching from the boot mode to the test mode. Moreover, the test is non-destructive to the boot critical logic such that a boot mode state of the integrated circuit is preserved when performing the test.

One example described herein is a field programmable gate array (FPGA) that includes boot critical circuitry configured to change a mode of the FPGA from a boot mode to a test mode, first circuitry, and LBIST circuitry configured to perform a test on the first circuitry in response to switching from the boot mode to the test mode. Moreover, the test is non-destructive such that a boot mode state of the FPGA is preserved when performing the test.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 5 is a flowchart for designing and operating non-destructive LBIST logic for localized logic, according to an example.

FIG. 6 illustrates an integrated circuit with non-destructive LBIST, according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
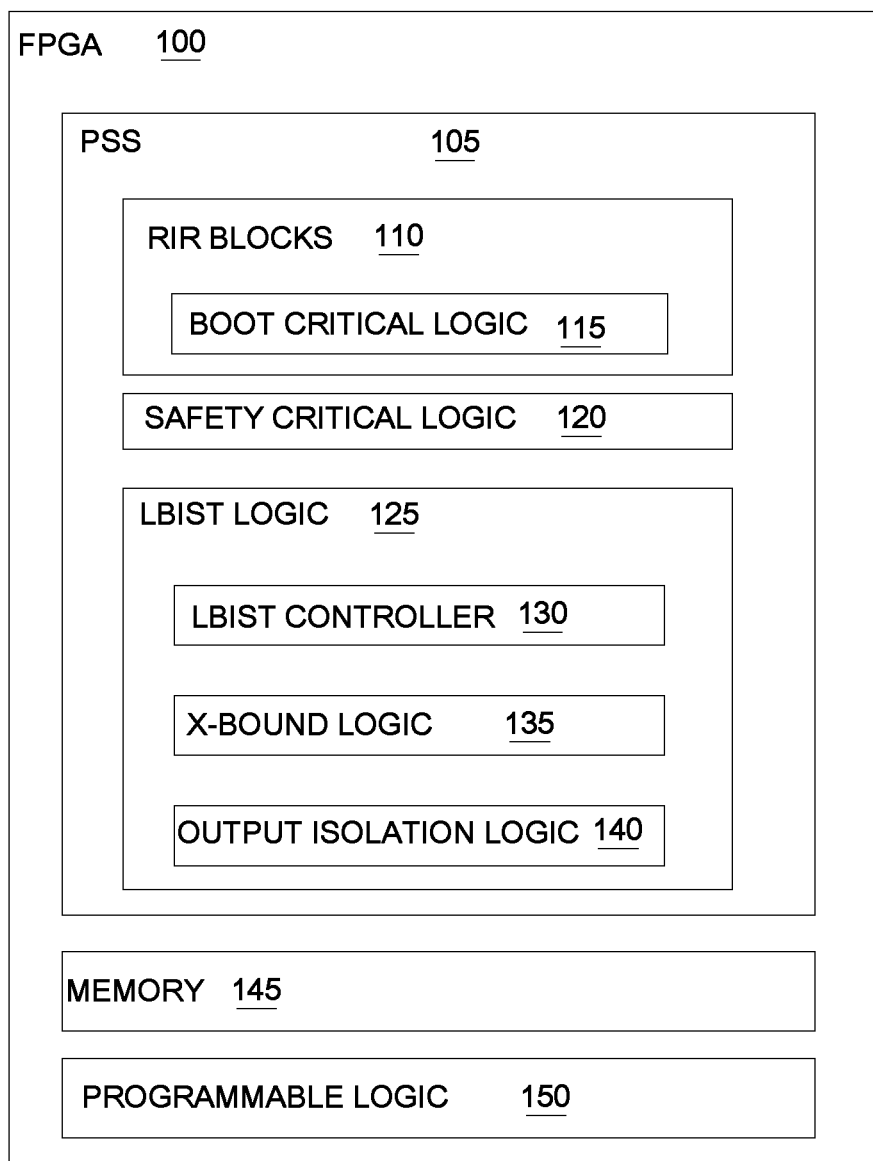
FIG. 1 is a block diagram of a field programmable gate array with a non-destructive LBIST logic, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe a methodology for performing non-destructive LBIST when booting an integrated circuit (IC). In one embodiment, when powered on, the IC begins the boot process which is then paused to perform LBIST or POST. However, instead of corrupting or destroying the boot mode state of the IC, the LBIST is non-destructive. That is, after LBIST is performed, the booting process can be resumed in the same state as when LBIST began.

In one embodiment, when designing the IC, a designer identifies boot critical logic whose state should be protected during the LBIST. The designer may add reverse isolation rings (RIR) blocks which gate the inputs of boot critical logic blocks to safe values during the boot process. This prevents the random test data generated by the LBIST from affecting the data or function performed by the boot critical logic. Moreover, the designer may evaluate the non-LBIST signals (i.e., signals not controlled by the LBIST logic) to determine whether these signals control or set the boot mode state of the IC during the boot process (e.g., whether these signals vary during the LBIST process). If the signal defines the boot mode state of the IC, the signal is added to an X-bound reject list. X-bound reject signals are not xbounded by defining a static value on these signals during xbounding step. By selectively applying X-bounding, the designer prevents X-bounding logic from corrupting the state of signals that define the boot mode state of the IC during the boot process.

In one embodiment, the LBIST is performed on safety critical logic in the IC. If this logic is confined in a central location of the IC (e.g., a hard macro) and is not intermingled with the boot critical logic, the designer can apply X-bound logic to all the non-LBIST signals of the safety critical logic block or hard macro. Further, the designer can add output protection logic which prevents the outputs of the safety critical logic from corrupting the boot mode state of downstream logic in the IC.

FIG. 1 is a block diagram of a field programmable gate array (FPGA) 100 with a non-destructive LBIST logic, according to an example. The FPGA 100 includes programmable sub-system (PSS) 105, memory 145, and programmable logic 150. The programmable logic 150 can include programmable elements that are configured using a register-transfer level (RTL) or hardware design language (HDL). In one embodiment, the programmable logic 150 includes a programmable network on a chip for permitting the various programmable elements to communicate.

The PSS 105 includes RIR blocks 110, safety critical logic 120, and LBIST logic 125. In one embodiment, the PSS 105 is in a parallel hierarch to the programmable logic 150 and can have separate flows for booting and controlling the circuitry within. Further, the PSS 105 may be contained within an application specific integrated circuit (ASIC) hard macro block. In one embodiment, the PSS 105 boots up as a master block for the FPGA 100.

The RIR blocks 110 include boot critical logic 115 that is protected so that this logic is not corrupted when performing the LBIST. Put differently, the RIR blocks 110 provide an interface that surrounds boot critical logic 115 so that this logic is not corrupted by the test data (or test vectors) generated by the LBIST logic 125. In one embodiment, the RIR blocks 110 include logic gates that block the test data from reaching the storage elements (e.g., flip flops or registers) in the boot critical logic 115 during LBIST. Thus, the state or function of the boot critical logic 115 is not corrupted or destroyed during LBIST.

The safety critical logic 120 is the logic being tested during the LBIST. Typically, ICs are tested after being manufactured (or configured in the case of an IC in an FPGA 100) using an external testing apparatus. However, the LBIST logic 125 can test the safety critical logic 120 each time the FPGA 100 is powered on. As such, the LBIST logic 125 can detect defects or errors that develop in the hardware elements forming safety critical logic 120 over time which may not exist when the FPGA 100 is first manufactured or configured.

In one embodiment, the LBIST logic 125 tests only the safety critical logic 120 but not other logic in the FPGA 100 which does not deal with safety. For example, if the FPGA 100 is a controller for a vehicle, the LBIST logic 125 may test the braking system but not the environmental control system which controls the temperature inside the vehicle. Put differently, the environmental control system may not be deemed part of the safety critical logic 120 and is thus, not tested when booting the FPGA 100 or performing a POST. Testing only the safety critical logic 120 can reduce the time required for booting the FPGA 100 and performing the LBIST.

The LBIST logic 125 includes an LBIST controller 130, X-bounding logic 135, and output isolation logic 140. The LBIST controller 130 generates test data or vectors for testing the safety critical logic 120 which may include random data or predefined data. In one embodiment, the LBIST controller 130 converts the memory elements (e.g., flip flops or registers) in the safety critical logic 120 into scan chains. The test data is then clocked through the scan chain. Although not shown in FIG. 1, the LBIST logic 125 can include a compressor which compresses the outputs of the scan chains into one or more signatures. If these signatures match predefined (or expected) signatures, the LBIST controller 130 indicates the safety critical logic 120 has passed the test and is behaving as expected.

The X-bounding logic 135 holds non-LBIST signals to safe or known values during the LBIST. The LBIST fails to provide an accurate result if there are uncontrolled or unknown signals (represented by an 'X') in the design. Capturing a single X into a scan chain corrupts the multiple-input signature register (MISR) and prevents the LBIST from outputting an accurate result. For example, non-scan flops, primary inputs, and read only memory (ROM) outputs are not controlled during LBIST testing, and thus, output non-LBIST signals which are not controllable and are labeled as X signals. To prevent the X signals from reaching the scan chains, the X-bounding logic 135 is added to the output of these components in order to set the outputs to a safe value (e.g., a known value such as a logical zero or one) during the LBIST. Thus, instead of inserting an uncontrolled X signal into the scan chains, a known signal is provided to the scan chains. At all other times, the X-bounding logic 135 is disabled.

However, some of the non-LBIST signals are necessary for the boot mode operation and should not be disturbed during POST. Put differently, X-bounding these signals can cause them to lose their state which may affect the remaining boot process. Since the logic blocks and non-LBIST signals necessary for the boot mode should not be disturbed during LBIST/POST, these logic blocks and signals are excluded from the LBIST scan chains. If these signals are out of LBIST scan chains then they are typically X-bounded since they are uncontrolled, and thus, are non-LBIST flops and sources of X's in the design. The fan-out cone of these non-LBIST flops will change (because of X-bounding) during POST and hence the boot mode state is lost. As such, in one embodiment, X-bounding is controlled or constrained so that boot mode state of design is not lost during POST. That is, not all of the non-LBIST signals are X-bounded using the X-bounding logic 135. The non-LBIST signals that are necessary for saving the boot mode state are not X-bounded, but instead are added to an X-bounding reject list. Because these non-LBIST signals are constant during the LBIST, they do not need to be X-bounded since they do not output X's but instead have constant values which can be accounted for when generating the expected signatures.

The output isolation logic 140 prevents the output signals of the safety critical logic 120 from affecting downstream logic in the FPGA 100 which can corrupt the boot mode state. That is, when performing LBIST, the safety critical logic 120 may output data which can be latched or stored in downstream logic thereby destroying their state. Instead, the output isolation logic 140 prevents the output of the safety critical logic 120 from negatively affecting the downstream logic. In one embodiment, the output isolation logic 140 also prevents data generated during the LBIST from being transmitted on output pads which can affect other ICs in the FPGA 100 or in other FPGAs. In this manner, the LBIST logic 125 can test the safety critical logic 120 without destroying the boot mode state of the IC during the boot process. Thus, after LBIST is complete, the boot process can continue in the same boot mode state as when the boot process was paused to perform LBIST.

The memory 145 represents volatile and non-volatile memory elements disposed in the FPGA 100. In one embodiment, the memory 145 includes ROM, BRAM, and the like. Although FIG. 1 illustrates an FPGA 100, the embodiments herein can apply to any IC whether programmable or non-programmable. Thus, the embodiments herein can apply to an application specific IC (ASIC) which is non programmable and performs an LBIST or POST during a boot process. Further, as used herein, "logic" can include circuitry or hardware elements in the FPGA or ASIC.

Figure 2:
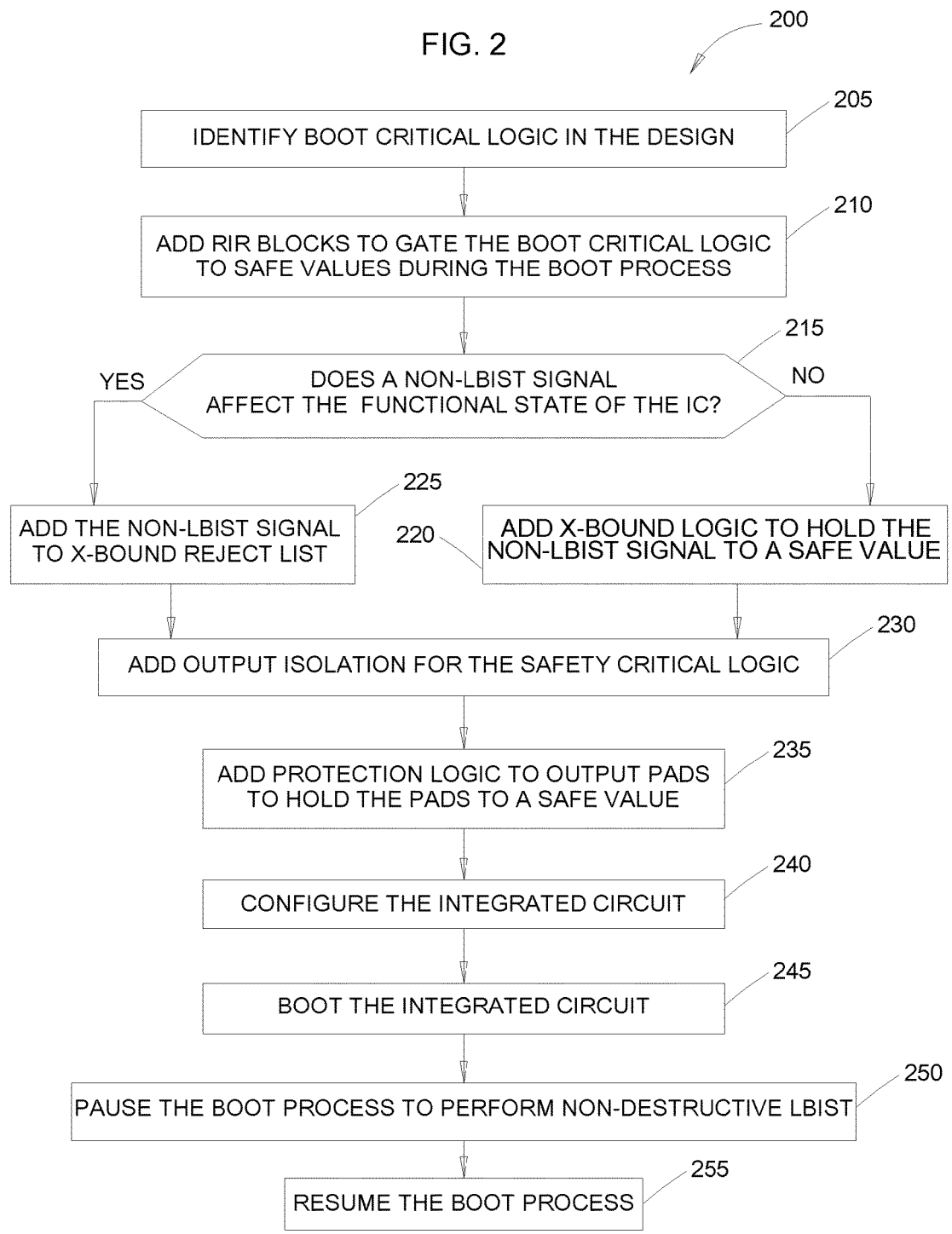
FIG. 2 is a flowchart for designing and operating non-destructive LBIST logic in an integrated circuit, according to an example.

FIG. 2 is a flowchart of a method 200 for designing and operating non-destructive LBIST logic in an IC, according to an example. In one embodiment, the method 200 is performed after a netlist defining the design of the IC has been generated. In one embodiment, test points have already been inserted into the netlist for testing a portion of the logic in the IC. Moreover, the netlist may include scan stitching for connecting the memory elements in the logic to be tested into scan chains for performing POST/LBIST.

At block 205, the designer identifies the boot critical logic in the IC. In one embodiment, the boot critical logic includes blocks of logic whose states should not be disturbed during POST. That is, the states of the boot critical logic define, at least in part, the boot mode state of the IC. In one embodiment, the boot critical logic includes clock and reset logic which may be used to clock the IC during the boot process and the LBIST. Permitting the test data to affect the clock and reset logic can have a negative impact on the POST or LBIST. In another embodiment, the boot critical logic includes efuse or efuse control which set the mode of the IC (e.g., switches the IC from the boot mode to the test mode to perform LBIST) and controls the characterization of analog blocks. Permitting the random values generated by the LBIST logic to affect the efuse logic can cause the IC to behave unpredictability.

In another embodiment, the boot critical logic includes an internal oscillator which is a source for the clock and reset logic or an analog block that monitors different voltages in the IC. In another embodiment, the boot critical logic is a tap controller or muxing structure.

At block 210, the designer, using a design tool, manually adds RIR blocks to gate the boot critical logic to safe values during the boot process. In one embodiment, the design tool is a software application executed using a computer processor. The RIR blocks isolate the boot critical logic to prevent the test data generated by the LBIST logic from changing the boot mode state or corrupting the boot critical logic. In one embodiment, the designer edits the netlist or RTL defining the design of the IC using the design tool so that the boot critical logic is out of the scan chains tested during the LBIST. Stated differently, there are not LBIST memory elements within the boot critical blocks.

In one embodiment, the LBIST control signals to the boot critical blocks are disabled or inactive during POST/LBIST and during functional boot mode. Thus, the LBIST control signals do not affect the boot mode state as set by the boot critical logic. Further, the RIR blocks define regions where X-bounding and LBIST test points are not placed. That way, the RIR blocks do not have X-bound logic or test points so that when performing LBIST, the boot critical blocks are unaffected.

The functional input signals to the RIR blocks are clamped to safe values during POST/LBIST so that the state of these blocks is not affected. In one embodiment, the state of the boot critical logic remains the same throughout POST and LBIST. Thus, when the POST/LBIST is complete, the boot critical blocks have the same boot mode state and the boot process can be resumed seamlessly.

At block 215, the designer determines which of the non-LBIST signals affect the boot mode state of the IC. Stated differently, the designer identifies which of the non-LBIST signals can toggle without impacting the boot process. In one embodiment, the designer may use a synthesis or simulator tool (e.g., a software application executed using a computer processor) to monitor the non-LBIST signals and determine which of those signals affect the boot mode state of the IC. As mentioned above, the non-LBIST signals originate from logic in the IC that is not controlled by the LBIST logic. That is, the non-LBIST signals do not originate, or are not driven, by a memory element in one of the LBIST scan chains.

Although the non-LBIST signals do not originate from LBIST controlled logic, the non-LBIST signals may be inputs into the LBIST scan chains. Stated differently, the non-LBIST signals affect the resulting signature calculated during LBIST. Because LBIST is not tolerant to unknown inputs—e.g., X's—the designer ensures that non-LBIST controlled signals are set to known values during LBIST. That is, the designer ensures that the non-LBIST signals do not randomly change values. The designer can add X-bounding logic to ensure the non-LBIST signals are set to known values. Because the X-bounding logic sets the values of the non-LBIST signals to known values, the LBIST logic can accurately calculate the expected signatures.

However, adding X-bounding logic to set the non-LBIST signals to known or safe values can corrupt the state of those signals. Put differently, the X-bounding logic may change the original or intended value of the non-LBIST signals thereby causing the boot mode state of the IC to change. In one embodiment, the non-LBIST signals that set the boot mode state of the IC do not toggle, thus they do not need to be X-bounded. That is, since these non-LBIST signals have known (constant) values, they do not need to be X-bounded in order for the expected LBIST signature to be calculated accurately. These non-LBIST signals are constrained to boot mode values during LBIST, and since they are not X-bounded, the signals retain their value after LBIST, thereby maintaining the boot mode state of the IC.

If the non-LBIST signals affects the boot mode state of the IC, the method 200 proceeds to block 225 where the signal is added to the X-bound reject list. That is, the non-LBIST signal does not toggle during LBIST, and thus, X-bound logic is not needed. Moreover, this preserves the boot mode state of the IC.

However, if the non-LBIST signal does not affect the boot mode state, the method 200 proceeds to block 220 where the designer, using the design tool, adds X-bound logic to hold the signal to a known value during LBIST. In one embodiment, some of the non-LBIST signals are X-bounded to a particular constant safe value and cannot attain an opposite value so that the signal does not impact the boot mode operation. Alternatively, some of the non-LBIST signals can be X-bounded to any constant value and can toggle during LBIST. That is, these non-LBIST signals do not need to be constant during LBIST since toggling these signals does not impact the boot mode operation.

Figure 3:
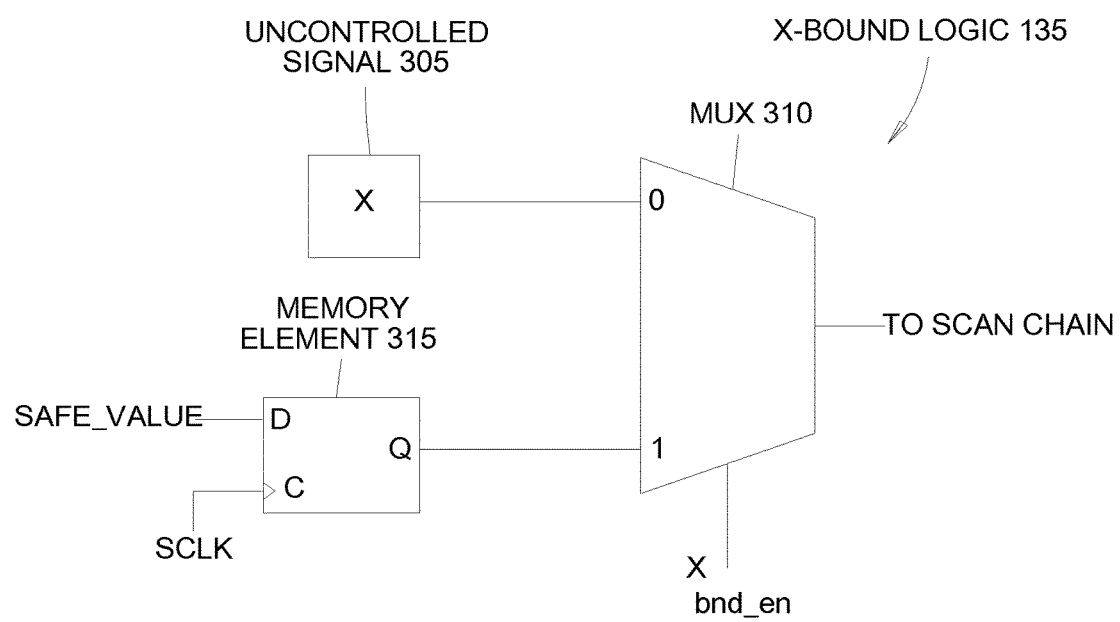
FIG. 3 illustrates X-bounding logic, according to an example.

FIG. 3 illustrates X-bounding logic 135, according to an example. As shown, an uncontrolled signal 305 (X) and an output of a memory element 315 are inputs to a multiplexer (MUX) 310. The uncontrolled signal 305 is an example of a non-LBIST signal that originates from logic in the IC that is not controlled by the LBIST logic. In one embodiment, the uncontrolled signal 305 is not driven by a memory element in a LBIST scan chain. The memory element 315, on the other hand, receives a safe value signal (SAFE_VALUE) which can be stored in the memory element 315 and outputted to the mux 310.

The output of the mux 310 is controlled by an X-bounding enable signal Xbnd_en which selects which of the two inputs is outputted from the mux 310 to downstream logic (e.g., a memory element in a LBIST scan chain). In one embodiment, the output of the mux 310 reaches the scan chains through a functional combinatorial logic cloud. When in the boot mode, the X-bounding enable signal outputs the uncontrolled signal 305 to the downstream logic. However, when the boot process is paused and POST/LBIST is performed, the mux 310 outputs the safe value stored in the memory element 315 to the scan chain. In this manner, the output of the mux 310 is known so that the expected signature can be accurately calculated.

Returning to the method 200, at block 230, the designer, using the design tool, adds output isolation logic for the safety critical logic. In one embodiment, the output isolation logic prevents the outputs of the LBIST scan chains formed using the safety critical logic from outputting data that can corrupt the state of the downstream logic in the IC. However, during normal operations (i.e., when POST/LBIST is not being performed), the output isolation logic allows the outputs of the safety critical logic to reach the downstream logic.

At block 235, the designer, using the design tool, adds protection logic to output pads on the IC to hold the pads to a safe value during POST or LBIST. Since permitting the data generated during LBIST to reach the output pads (and thus, be transmitted to other ICs) can corrupt neighboring ICs, the protection logic prevents the LBIST test data from reaching the pads. Instead, the protection logic holds the pads to safe values which do not affect the IC or circuits coupled to the pads.

At block 240, the designer configures the IC using the design generated during blocks 205-235. For example, if the IC is programmable, the design tool converts the design into a binary file which is then streamed to the programmable IC (e.g., an FPGA). If the IC is an ASIC, the design tool generates a layout and masks for fabricating the ASIC.

Figure 4:
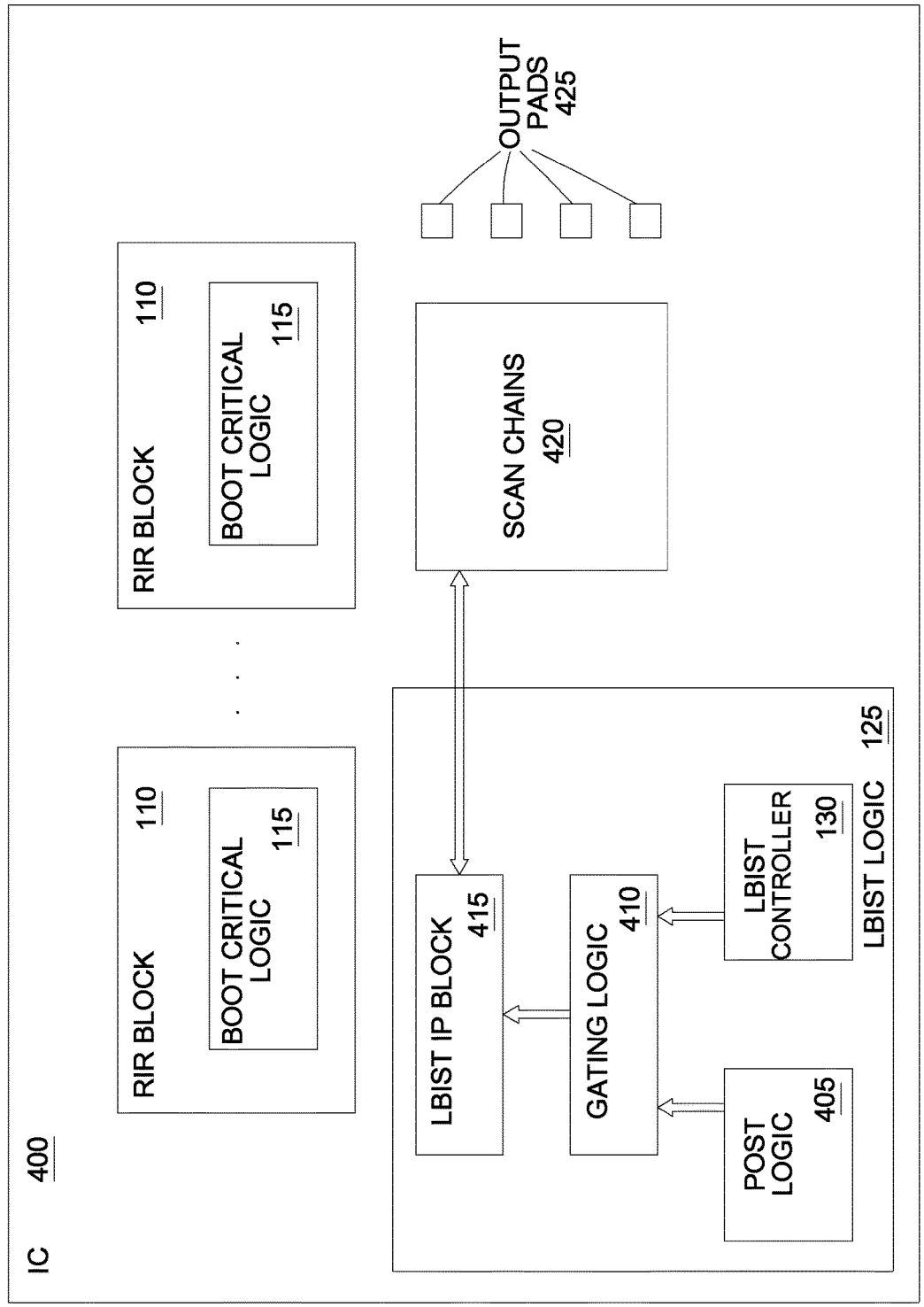
FIG. 4 illustrates an integrated circuit with non-destructive LBIST, according to an example.

FIG. 4 illustrates an IC 400 with non-destructive LBIST which can be configured during block 240 of the method 200. As shown, the IC 400 includes RIR blocks 110 which include the boot critical logic 115, the LBIST logic 125, scan chains 420, and output pads 425.

The RIR blocks 110 prevent LBIST/POST from corrupting the data stored in the boot critical logic 115 as described above. Although not shown, regular scan test data can be used to test the boot critical logic 115 which does not corrupt the state of the boot critical logic 115 or prevent the boot critical logic 115 from performing its intended function.

The LBIST logic 125 includes POST logic 405, the LBIST controller 130, gating logic 410, and a LBIST IP block 415. When in the test mode, the POST logic 405 and the LBIST controller 130 generate test data or vectors for testing scan chains 420 formed from the memory elements in the safety critical logic. The gating logic 410 can include muxes for gating the signals provided by the POST logic 405 and the LBIST controller 130.

In one embodiment, the LBIST IP block 415 includes a pseudo random pattern generator (PRPG), a decompressor, a compressor, and a multiple input signature register (MISR). The LBIST IP block 415 compresses the output of the scan chains 420 to generate a signature which is compared to the expected signature. That is, because the LBIST logic 125 knows the inputs to the scan chains 420 (because all the X signals have been X-bounded), the logic 125 can generate an expected signature which is compared to the actual signatures generated by the LBIST IP block 415. If the actual and expected signatures match, the LBIST logic 125 indicates that the safety critical logic is functioning properly.

In one embodiment, as the IC 400 includes an interface between the LBIST logic 125 and the output pads 425. The interface includes protection logic for preventing the outputs of the safety critical logic from reaching the output pads 425 when performing POST or LBIST. However, in other embodiments, the interface permits the result of performing POST or LBIST to reach the output pads 425 so that an external system is informed whether the safety critical logic passed or failed the POST or LBIST.

Although not shown in FIG. 4, the LBIST logic 125 may also communicate with the boot critical logic 115. For example, the LBIST logic 125 may output LBIST chopper controls to a chopper in the boot critical logic 115.

Returning to method 200, at block 245, the integrated circuit is booted and begins to perform a boot process. At block 250, control circuitry in the integrated circuit (e.g., efuse or efuse control) pauses the boot process to perform non-destructive LBIST using the LBIST logic. Assuming the LBIST was performed successfully, the method 200 proceeds to block 255 where the control circuitry resumes the boot process. Because the LBIST was non-destructive—i.e., does not change the boot mode state of the integrated circuit—the boot process can be resumed seamlessly in the same state as if the LBIST was never performed.

FIG. 5 is a flowchart of a method 500 for designing and operating non-destructive LBIST logic for localized logic, according to an example. At block 505, the designer or design tool determines whether the safety critical logic is at a single location in the IC. In one embodiment, the safety critical logic is encapsulated by a hard macro in the IC. The hard macro (also referred to a macro cell) specifies how the logic elements in the macro are interconnected and the physical pathways and wiring patterns between the components. In contrast, a soft macro defines the logic elements in the macro but does not specify the physical wiring pattern that interconnects the logic elements.

When designing the IC, the designer may make a design choice whether to place the safety critical logic (i.e., the logic that is tested during the booting process) in a hard macro or to distribute the safety critic logic with the boot critical logic. Put differently, in some instances it may be impossible to place the safety critical logic in a single location in the IC.

If the logic to be tested is not disposed at a single location (e.g., within the same hard macro), the method 200 is used to design the IC. For example, the designer performs blocks 205-235 to identify the boot critical logic, add RIR blocks, identify non-LBIST signals that belong on the X-bound reject list, identify non-LBIST signals that should be X-bounded, and add isolation logic for the logic to be tested and the output pads. However, if the logic to be tested is at a single location, the method 500 proceeds to block 510 where the designer, using a design tool, adds input X-bound logic. Unlike in the method 200 where the designer considers whether the input non-LBIST signals should be X-bounded or should be left with their original values (i.e., add the signals to the X-bound reject list), in method 500 the designer may X-bound all the non-LBIST signals received by the logic to be tested.

FIG. 6 illustrates an IC 600 with non-destructive LBIST logic, according to an example. The IC 600 includes a hard macro 605 that includes the logic to be tested and the LBIST logic. In one embodiment, the hard macro 605 does not include boot critical logic or other logic that is used to control or define the functional state (e.g., the boot mode state) of the IC 600.

In this example, the LBIST logic includes input X-bounding logic 610, the LBIST IP block 415, scan chain router 615, and output isolation logic 625. In one embodiment, the X-bounding logic 610 gates all of the non-LBIST signals received by the logic to be tested—i.e., scan chains 620—in the hard macro 605. That is, because the inputs are not used by the boot critical logic (since there is no boot critical logic in the hard macro 605), all of the inputs can be X-bounded. Thus, during POST/LBIST, all of the inputs are X-bounded to known values (which can toggle or remain constant). When not performing POST (i.e., during the booting process), the input X-bounding logic 610 permits the uncontrolled signals (X signals) to reach the logic under test.

The LBIST IP block 415 controls the scan chain router 615 to insert test vectors into the scan chains 620 which includes the memory elements in the logic to be tested (e.g., the safety critical logic). As mentioned above, the LBIST IP block 415 may include a compressor for compressing the output data generated by the scan chains 620 to form respective signatures. If the signatures match the expected signatures generated using the inserted test data, the LBIST IP block 415 (or the LBIST controller which is not shown in FIG. 6) indicates the memory elements in the scan chains 620 are behaving as expected.

The output isolation logic 625 prevents the outputs of the scan chains 620 from affecting downstream logic—i.e., logic disposed in the IC 600 outside the hard macro 605. For example, the output isolation logic 625 may block the outputs of the scan chains 620 during POST/LBIST but permit the outputs of the safety critical logic to reach other macros in the IC 600 during normal operation.

Returning to the method 500, at block 515, the designer, using the design tool, adds output isolation (e.g., the output isolation logic 625) to the macro containing the logic to be tested and the LBIST logic. In this manner, the logic to be tested can be isolated from the boot critical logic. As a result, performing LBIST is non-destructive to the boot mode state of the IC 600. Once POST/LBIST is complete, the boot process can be resumed in the same state as when the boot process was paused to perform testing.

In the preceding, reference is made to embodiments presented in this disclosure. However, the scope of the present disclosure is not limited to specific described embodiments. Instead, any combination of the features and elements provided above, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

The present invention may be a system, a method, and/or a computer program product. The computer program product may include a computer-readable storage medium (or media) having computer readable program instructions thereon for causing a processor to carry out aspects of the present invention.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction(s) execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction(s) execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instruction(s)s may also be loaded onto a computer, other programmable data processing apparatus, or other devices to cause a series of operational blocks to be performed on the computer, other programmable apparatus or other devices to produce a computer implemented process such that the instruction(s)s which execute on the computer or other programmable apparatus provide processes for implementing the functions/acts specified in the flowchart and/or block diagram block or blocks.

The flowchart and block diagrams in the Figs. illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to specific examples, other and further examples may be devised without departing from the basic scope thereof, and the scope thereof is determined by the claims that follow.

What is claimed is:

1. An integrated circuit, comprising:
   boot critical circuitry configured to change a mode of the integrated circuit from a boot mode to a test mode;
   first circuitry;
   logic built-in self test (LBIST) circuitry configured to perform a test on the first circuitry in response to switching from the boot mode to the test mode, wherein the test is non-destructive to the boot critical circuitry such that a boot mode state of the integrated circuit is preserved when performing the test; and
   output isolation circuitry coupled to an output of a first scan chain in the first circuitry, wherein the output isolation circuitry is configured to prevent output signals generated by the first scan chain from destroying the boot mode state during the test.

2. The integrated circuit of claim 1, further comprising:
   X-bound circuitry configured to apply a safe value to a first non-LBIST signal when performing the test, wherein the first non-LBIST signal is an input to the first scan chain in the first circuitry and does not change the boot mode state; and
   a second non-LBIST signal that is an input to a second scan chain in the first circuitry, wherein the second non-LBIST signal sets, at least in part, the boot mode state and is not X-bounded during the test.

3. The integrated circuit of claim 1, further comprising:
   X-bound circuitry configured to apply safe values to all non-LBIST signals when performing the test, wherein the non-LBIST signals are inputs to one or more scan chains which includes the first scan chain in the first circuitry, and
   wherein the first circuitry and the LBIST circuitry are disposed in a single location in the integrated circuit.

4. The integrated circuit of claim 3, wherein the first circuitry and the LBIST circuitry are disposed in a same hard macro in a design of the integrated circuit.

5. The integrated circuit of claim 1, further comprising:
   reverse isolation rings (RIR) circuitry comprising the boot critical circuitry, the RIR circuitry configured to prevent test data generated by the LBIST circuitry from changing the boot mode state during the test.

6. The integrated circuit of claim 1, wherein the test is non-destructive such that the boot mode state of the integrated circuit is the same as before the test was performed and a boot process can be seamlessly resumed after the test is complete.

7. The integrated circuit of claim 1, wherein the boot critical circuitry, the first circuitry, and the LBIST circuitry are formed using programmable logic in an field programmable gate array (FPGA).

8. A method of designing an integrated circuit, the method comprising:
   adding, using a design tool, boot critical logic to a design of the integrated circuit, the boot critical logic is configured to change a mode of the integrated circuit from a boot mode to a test mode;
   adding, using the design tool, first logic to the design;
   adding, using the design tool, LBIST logic configured to perform a test on the first logic in response to switching from the boot mode to the test mode, wherein the test is non-destructive to the boot critical logic such that a boot mode state of the integrated circuit is preserved when performing the test; and
   adding RIR logic to the design, the RIR logic comprising the boot critical logic, the RIR logic prevents test data generated by the LBIST logic from changing the boot mode state during the test.

9. The method of claim 8, further comprising:
   identifying a first non-LBIST signal that is an input to a first scan chain in the first logic, wherein the first non-LBIST signal can toggle during the test without changing the boot mode state;

adding X-bound logic to the design to set the first non-LBIST signal to a known value during the test;

identifying a second non-LBIST signal that is an input to a second scan chain in the first circuitry, wherein the second non-LBIST signal sets the boot mode state; and adding the second non-LBIST signal to a X-bound reject list.

10. The method of claim 8, further comprising:

adding X-bound logic to the design, the X-bound logic applies safe values to all non-LBIST signals when performing the test, wherein the non-LBIST signals are inputs to one or more scan chains in the first logic, wherein the first logic and the LBIST logic are disposed in a single location in the design.

11. The method of claim 10, wherein the first logic and the LBIST logic are disposed in a same hard macro in the design.

12. The method of claim 8, further comprising:

adding output isolation logic to the design, wherein the output isolation logic is coupled to an output of a scan chain in the first logic, wherein the output isolation logic is configured to prevent output signals generated by the scan chain from destroying the boot mode state during the test.

13. The method of claim 8, wherein the test is non-destructive such that the boot mode state of the integrated circuit is the same as before the test was performed and a boot process can be seamlessly resumed after the test is complete.

14. The method of claim 8, further comprising:

configuring an FPGA using the design, wherein the FPGA comprises the integrated circuit.

15. An FPGA, comprising:

boot critical circuitry configured to change a mode of the FPGA from a boot mode to a test mode;

first circuitry;

LBIST circuitry configured to perform a test on the first circuitry in response to switching from the boot mode to the test mode, wherein the test is non-destructive such that a boot mode state of the FPGA is preserved when performing the test;

X-bound circuitry configured to apply a safe value to a first non-LBIST signal when performing the test, wherein the first non-LBIST signal is an input to a first scan chain in the first circuitry and does not change the boot mode state; and a second non-LBIST signal that is an input to a second scan chain in the first circuitry, wherein the second non-LBIST signal sets, at least in part, the boot mode state and is not X-bounded during the test.

16. The FPGA of claim 15, wherein the first circuitry comprises safety critical logic that is tested by the LBIST circuitry each time the FPGA is powered on.

17. The FPGA of claim 15, further comprising:

second logic that is not tested by the LBIST circuitry each time the FPGA is powered on.

18. The FPGA of claim 15, wherein the test is non-destructive such that the boot mode state of the FPGA is the same as before the test was performed and a boot process can be seamlessly resumed after the test is complete.

* * * * *